United States Patent
Clingerman et al.

(10) Patent No.: US 6,304,679 B1
(45) Date of Patent: Oct. 16, 2001

(54) METHOD AND APPARATUS FOR IMPLEMENTING TWO-DIMENSIONAL DIGITAL FILTERS

(75) Inventors: Terri A. Clingerman, Palmyra; Leon C. Williams, Walworth, both of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 08/297,437

(22) Filed: Aug. 29, 1994

Related U.S. Application Data

(63) Continuation of application No. 07/809,897, filed on Dec. 18, 1991, now abandoned.

(51) Int. Cl.[7] ............................ G06K 9/36; G06K 9/40
(52) U.S. Cl. ....................... 382/277; 382/260; 708/300
(58) Field of Search ........................ 382/41, 27, 260, 382/261, 265, 277, 304; 358/455, 462, 443, 445, 448; 348/607, 608, 614; 364/728.01, 724.05, 724.12, 724.13, 825, 724.19; 708/300

(56) References Cited

U.S. PATENT DOCUMENTS

| | | | |
|---|---|---|---|
| 4,328,426 | * | 5/1982 | D'Ortenzio ............................ 382/41 |
| 4,602,285 | * | 7/1986 | Beaulier et al. ...................... 382/260 |
| 4,667,304 | * | 5/1987 | Hier et al. ............................ 364/82.5 |
| 4,700,324 | * | 10/1987 | Doi et al. .......................... 364/728.01 |
| 4,760,605 | * | 7/1988 | David et al. ............................. 382/47 |
| 4,862,403 | * | 8/1989 | Iwase et al. ...................... 364/724.05 |
| 5,027,423 | | 6/1991 | Kawata et al. .......................... 382/54 |
| 5,068,905 | * | 11/1991 | Hackett et al. ......................... 382/54 |
| 5,093,632 | * | 3/1992 | Hietala et al. ............................ 331/1 |
| 5,131,059 | * | 7/1992 | Kobayashi et al. .................. 382/270 |
| 5,151,953 | * | 9/1992 | Landeta ................................. 382/41 |
| 5,561,617 | * | 10/1996 | van der Wal ..................... 364/724.05 |

FOREIGN PATENT DOCUMENTS

| | | | |
|---|---|---|---|
| A2632470 | 8/1989 | (FR) | .............................. H04N/5/262 |
| A2184316 | 6/1987 | (GB) | .............................. H04N/5/262 |

OTHER PUBLICATIONS

"Principles and Applications of Digital Electronics" by Larry D. Jones, pp. 216–217, 1986.*

* cited by examiner

Primary Examiner—Bhavesh Mehta

(57) ABSTRACT

A structure for implementing a plurality of two-dimensional digital filters, such as finite impulse response filters, in an efficient manner. The structure includes a plurality of first stage filters operating in a first dimension in combination with a single second stage filter, operating in a second dimension. The second stage filter being suitable for receiving output from one of the first stage filters. A controller, operating in conjunction with the first and second stage filters is utilized for controlling the operation of all filters, as well as the selection of the input source for the second stage filter.

21 Claims, 9 Drawing Sheets

METHOD AND APPARATUS FOR IMPLEMENTING TWO-DIMENSIONAL DIGITAL FILTERS

This is a continuation, of application Ser. No.07/809,897, filed Dec. 18, 1991 now abandoned.

This invention relates generally to a digital signal processing apparatus, and more particularly to the implementation of a plurality of two-dimensional digital filters using a series of one-dimensional transformations.

CROSS REFERENCE

The following related applications and patents are hereby incorporated by reference for their teachings:

"Improved Automatic Image Segmentation," Shiau et al., Serial No. 07/722,568, filed Jun. 27, 1991;

"Method and Apparatus for Controlling the Processing of Digital Image Signals", Williams et al., Ser. No. 07/809,807, filed Dec. 18, 1991;

U.S. Pat. No. 4,811,115 to Lin et al., Issued Mar. 7, 1989; and

U.S. Pat. No. 4,897,803 to Calarco et al., Issued Jan. 30, 1990.

COPYRIGHT NOTIFICATION

A portion of the disclosure of this patent document contains material which is subject to copyright protection. The copyright owners have no objection to the facsimile reproduction, by anyone, of the patent document or the patent disclosure, as it appears in the Patent and Trademark Office patent file or records, but otherwise reserves all copyright rights whatsoever.

BACKGROUND OF THE INVENTION

The features of the present invention may be used in the printing arts and, more particularly, in digital image processing and electrophotographic printing. In digital image processing there is a distinct advantage to being able to provide digital filtering in an efficient and low cost manner. With regard to efficiency, it is advantageous to design hardware implementations of digital filters that are efficient This efficiency has two factors, first a speed of processing factor, and second a hardware minimization factor. For example, improved processing efficiency or speed may be achieved by adding hardware, however, this may not be a practical solution when one has to consider the cost of the additional hardware. The second factor becomes increasingly important when implementing the device as an application specific integrated circuit (ASIC), where the addition of hardware elements may result in the need for a larger die package. Accordingly, the present invention provides a two-dimensional digital filter that is efficient with respect to processing speed and hardware implementation, as well.

Signal processing devices usually require filters, especially two-dimensional filters to process data in numerous ways. Well known electrophotographic systems, for example, the Xerox® Docutech Production Publisher®, usually employ digital hardware and application specific integrated circuit (ASIC) devices specifically designed to provide digital filtering capabilities. Generally, this type of system would employ hardware, software, or a combination of both to implement the digital filtering capabilities required. Various approaches have been devised for the implementation of digital filtering techniques, of which the following disclosures appear to be relevant:

U.S. Pat. No. 4,766,561
Patentee: Thompson et al.
Issued: Aug. 23, 1988
U.S. Pat. No. 4,777,612
Patentee Tomimitsu
Issued: Oct. 11, 1988
U.S. Pat. No. 4,82 1,223
Patentee: David
Issued: Apr. 11, 1989

The relevant portions of the foregoing patents may be briefly summarized as follows:

U.S. Pat. No. 4,766,561 to Thompson et al. discloses a circuit for performing a plurality of finite impulse response filtering functions. The circuit comprises a plurality of filters, each implementing a predetermined digital filter algorithm. A storage circuit stores coefficients and data operands utilized in implementing the predetermined algorithms. An arithmetic unit is coupled to the storage circuit for performing predetermined arithmetic operations with selected coefficient and data operands, and a sequencing control device sequentially selects operands from the storage circuit for input to the arithmetic unit.

U.S. Pat. No. 4,777,612 to Tomimitsu discloses a digital signal processing apparatus for providing high-speed digital filtering. The apparatus includes at least two digital filters in parallel and a multiplexer for alternatively outputting the outputs of the filters.

U.S. Pat. No. 4,821,223 to David describes a two-dimensional finite impulse response filter having a plurality of filter portions of substantially identical construction arranged in a parallel configuration A demultiplexer separates an input data signal comprising consecutive digital words and supplies each digital word in sequence to a separate filter portion. Subsequently, a multiplexer coupled to the outputs of the filter portions selectively outputs the filtered data from each filter portion in a sequence corresponding to the order of separation of the input data, thereby resulting in a filtered version of the original input data The present invention seeks to overcome the limitations of the related references by providing a plurality of one-dimensional (1-D) transform units that may be selectively combined with an additional one-dimensional transform unit to produce a plurality of distinct two-dimensional (2-D) filters, any one of which is selectable on a pixel by pixel basis. Moreover, the present system has the added advantage of providing these two-dimensional finite impulse response filters without employing multiple, identically constructed two-dimensional filters arranged in a parallel fashion, thereby substantially reducing the complexity and cost of the filter hardware.

In accordance with one aspect of the present invention, there is provided an apparatus for implementing a plurality of two-dimensional digital filters having a plurality of first stage filters operating in a first dimension in combination with a single second stage filter, operating in a second dimension, the filter operating in the second dimension being suitable for receiving output from one of the filters operating in the first dimension. A controller, operating in conjunction with the filters is utilized for controlling the operation of all filters, as well as selection of the input source for the second dimension filter.

Pursuant to another aspect of the present invention, there is provided an apparatus for implementing the plurality of two-dimensional digital filters by separating the transformations carried out by the filters into separate elements, thereby reducing the complexity of the hardware needed to implement the filters.

Pursuant to another aspect of the present invention, there is provided a method for selectively filtering a single digital data element in a two-dimensional filter by first applying a selected one-dimensional transformation, said transformation being selected from a plurality of possible transformations. Next, storing the context associated with the single data element until the context is passed to the second one-dimensional transform, to produce the two-dimensional filtered output.

The present invention will be described in connection with a preferred embodiment, however, it will be understood that there is no intent to limit the invention to that embodiment. On the contrary, the intent is to cover all alternatives, modifications, and equivalents as may be included within the spirit and scope of the invention as defined by the appended claims.

BRIEF DESCRIPTION OF THE APPENDICES

The following description makes reference to a collection of Appendices (A and B) which are included with this specification, the contents of which may be briefly characterized as follows:

Appendix A comprises the listings of an object oriented C code module used to simulate the operation of the two-dimensional filters of the present invention; and Appendix B includes the listings of the declaration files associated with the module of Appendix A.

DESCRIPTION OF THE PREFERRED EMBODIMENT

The following description includes references to slow scan and fast scan digital image data when discussing the directionality of the two-dimensional filtering architecture. For purposes of clarification, fast scan data is intended to refer to individual pixels located in succession along a raster of image information, while slow scan data refers to data derived from a common raster position across multiple rasters or scanlines. As an example, slow scan data would be used to describe signals captured from a plurality of elements along a linear photosensitive array as the array was moved relative to a document. On the other hand, fast scan data would refer to the sequential signals collected along the length of the linear photosensitive array during a single exposure period, and is also commonly referred to as a raster of data.

Figure 1:
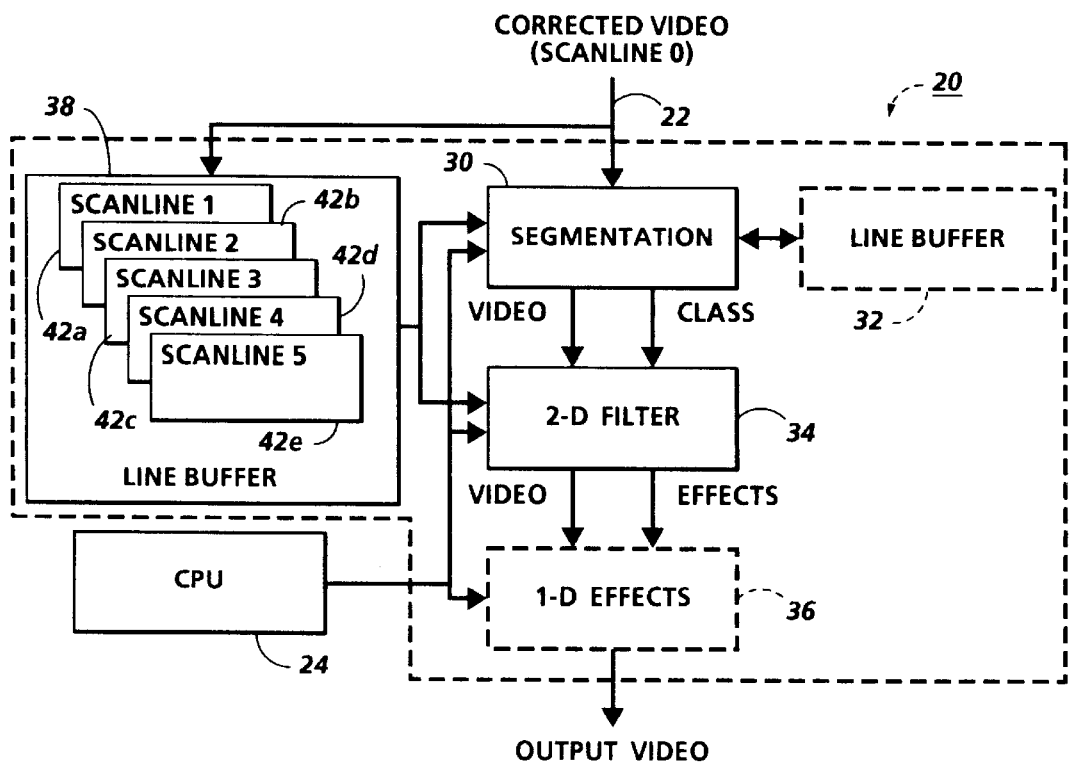
FIG. 1 is a schematic illustration of an image processing hardware module incorporating the two-dimensional filter of the present invention.

For a general understanding of the image processing hardware module incorporating the features of the present invention, reference is made to the drawings. In the drawings, like reference numerals have been used throughout to designate identical elements. FIG. 1 schematically depicts the various components of a digital image processing hardware module, such as might be used in a electrophotographic system for the processing and alteration of a video signal prior to its output.

Referring now to FIG. 1, which illustrates a possible image processing module architecture, image processing module 20 would generally receive offset and gain corrected video on input line 22. The video input data may be derived from a number of sources, including a raster input scanner, a graphics workstation, or electronic memory and similar storage elements. Moreover, the video input data in the present embodiment generally comprises 8-bit gray data, passed in a parallel fashion along the input data bus. Subsequently, module 20 would process the input video data according to control signals from CPU 24 to produce the output video signals on line 26. As illustrated, module 20 may include an optional segmentation block 30 which has an associated line buffer 32, two-dimensional filter 34, and an optional one-dimensional effects block, 36. Also included in module 20 is line buffer memory 38, comprising individual scanline buffers 42a–42e, for storing the context of incoming scanlines 1 through 5, respectively.

Segmentation block 30, in conjunction with associated scanline buffer 32, which provides at least one scanline line of storage, is intended to parse the incoming video data to automatically determine those areas of the image which are representative of a halftone input region. Output from the segmentation block (Video Class) is used to implement subsequent image processing effects in accordance with the type or class of video signals identified by the segmentation block. For example, the segmentation block may identify a region containing data representative of an input halftone image, in which case a low pass filter would be used to remove screen patterns, otherwise, a remaining text portion of the input video image may be processed with an-edge enhancement filter to improve fine line and character reproduction when thresholded. Further details of segmentation block 30 may be found in the pending U.S. Patent application for "Improved Automatic Image Segmentation" (Ser. No. 07/722,568) by Shiau et al., the teachings of which are hereby incorporated by reference in the instant application. Another relevant reference is U.S. Pat. No. 4,811,115 to Lin et al. (Issued Mar. 7, 1989) which teaches the use of an approximate auto-correlation function to determine the frequency of a halftone image area. The relevant portions of U.S. Pat. No. 4,811,115 are hereby incorporated for its teachings with respect to halftone image identification. One important aspect of incorporating the segmentation block in the image processing module is the requirement for a one scanline delay in video output. This requirement stems from the fact that the segmentation block needs to analyze the incoming line prior to determining the characteristics of the incoming video. Hence, the incoming corrected video is fed directly to segmentation block 30 while being delayed, for subsequent use by two-dimensional filter 34, in line buffer memory 38.

Two-dimensional filter block 34, incorporating the elements of the present invention, is intended to process the incoming, corrected video in accordance with a predetermined filtering selection. As illustrated by line buffer memory 38, up to a total of 5 scanlines of incoming video data may be used to establish the context upon which the two-dimensional filter is to operate. Prior to establishment of the required scanline context, the input video bypasses the filter by using a bypass channel within the two-dimensional filter hardware. This bypass is necessary to avoid deleterious affects to the video stream that may result from filtering of the input video prior to establishing the proper context.

Subsequent to two-dimensional filtering, the optional one-dimensional effects block is used to alter the filtered, or possibly unfiltered, video data in accordance with selected one-dimensional video effects. One-dimensional video effects include, for example, thresholding, screening, inversion, tonal reproduction curve (TRC) adjustment, pixel masking, one-dimensional scaling and other effects which may be applied one-dimensionally to the stream of video signals. As in the two-dimensional filter, the one-dimensional effects block also includes a bypass channel, where no additional effects would be applied to the video, thereby enabling the 8-bit filtered video to be passed through as output video.

Control of the various combinations of "effects" and filter treatments to be applied to the video stream is enacted by CPU 24. Through the establishment of window tiles, various processing methods can be controlled by directly writing to control memory, from which the operation of the image processing blocks is regulated. More specifically, independent portions of the incoming video stream, portions selectable on a pixel by pixel basis, are processed in accordance with predefined image processing parameters. The selection of the specific parameters may be accomplished by selectively programming the features prior to or during the processing of the video stream. Also, the features may be automatically selected as previously described with respect to image segmentation block 30. In general, CPU 24 is used to initially program the desired image processing features, as well as, to update the feature selections during real-time processing of the video. Further details of the programming and selection of the image processing treatments is included in copending U.S. Patent application "Window Region Generation for Scanning Using Tiles" by Williams et al. (Ser. No. 07/809,807), the relevant portions of which are hereby incorporated by reference in the instant application. In an alternative embodiment, the data for each pixel of image information may have an associated identifier or token to control the image processing operations performed thereon, as described in U.S. Pat. No. 4,897,803 to Calarco et al. (Issued Jan. 30, 1990). The relevant portions of U.S. Pat. No. 4,897,803 are hereby incorporated by reference for its teachings with respect to methods for controlling the processing of digital image data.

Figure 2:
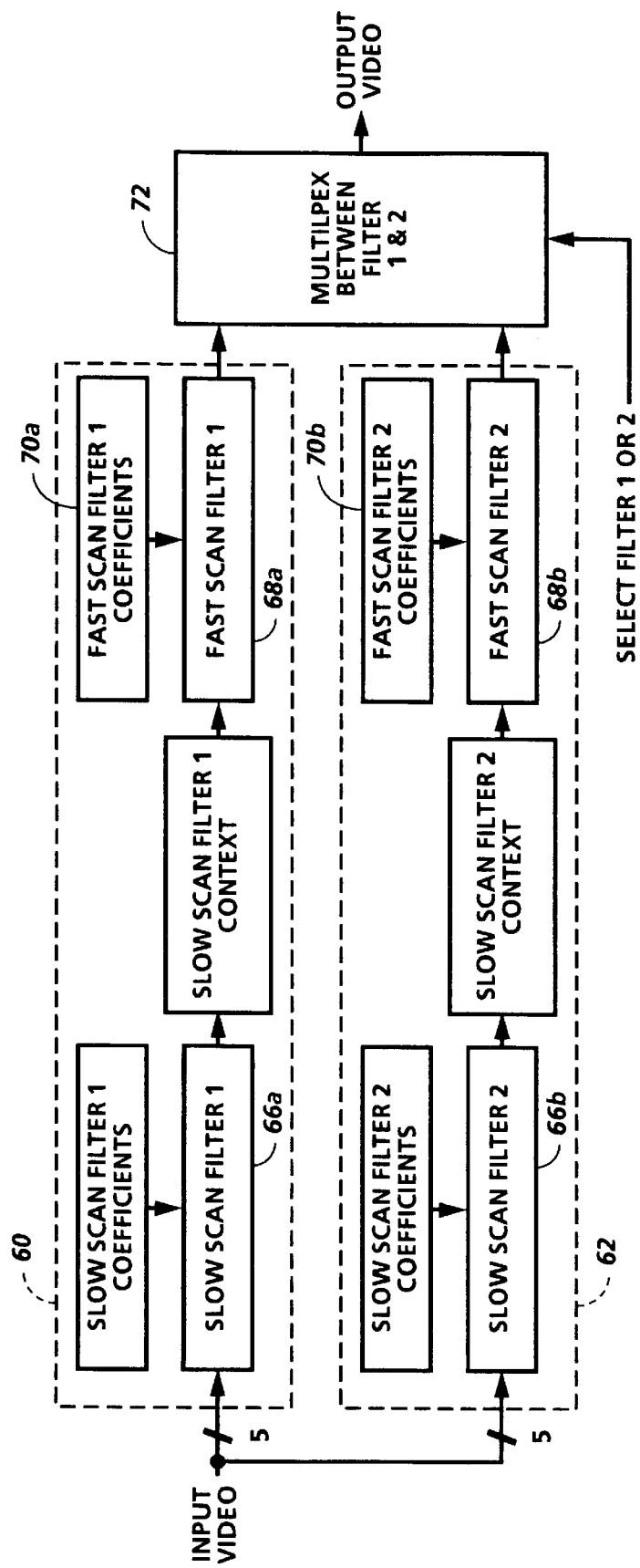
FIG. 2 is a block diagram illustrating the components used in the prior art implementations of two-dimensional filters.

Referring now to FIG. 2, which displays the prior art approach for implementation of the two-dimensional digital filters, two independent filter channels, 60 and 62 are contained within the single two-dimensional filter hardware device, 34 of FIG. 1. More importantly, in order to implement the pair of two-dimensional filters, of which only a single output is used at any time, two slow scan filters, 66a and 66b, operate on individual pixels within a particular scanline simultaneously. Subsequently, the outputs from slow scan filters 66a and 66b are passed to independent fast scan filters 68a and 68b, respectively. Individual application of fast scan filter coefficients 70a and 70b to filters 68a and 68b results in the filtered output of channels 60 and 62, respectively. Subsequently, the output of one of the channels is selected via multiplexer 72 in order to provide filtered video output on a pixel by pixel basis. While the illustration of the prior art may at first appear to be relatively efficient, from a hardware standpoint, it is important to consider what such a parallel filter architecture would require to implement n two-dimensional filtering operations, where any of n filters may be selected on a pixel by pixel basis. One can see that, although the slow scan filter of each channel is required to maintain the context of the data being filtered, the use of n fast scan filters is a purely redundant application of hardware. Hence the modified two-dimensional filter architecture of the present invention was developed to take advantage of the potential hardware reductions in an image processing module of this type.

Figure 3:
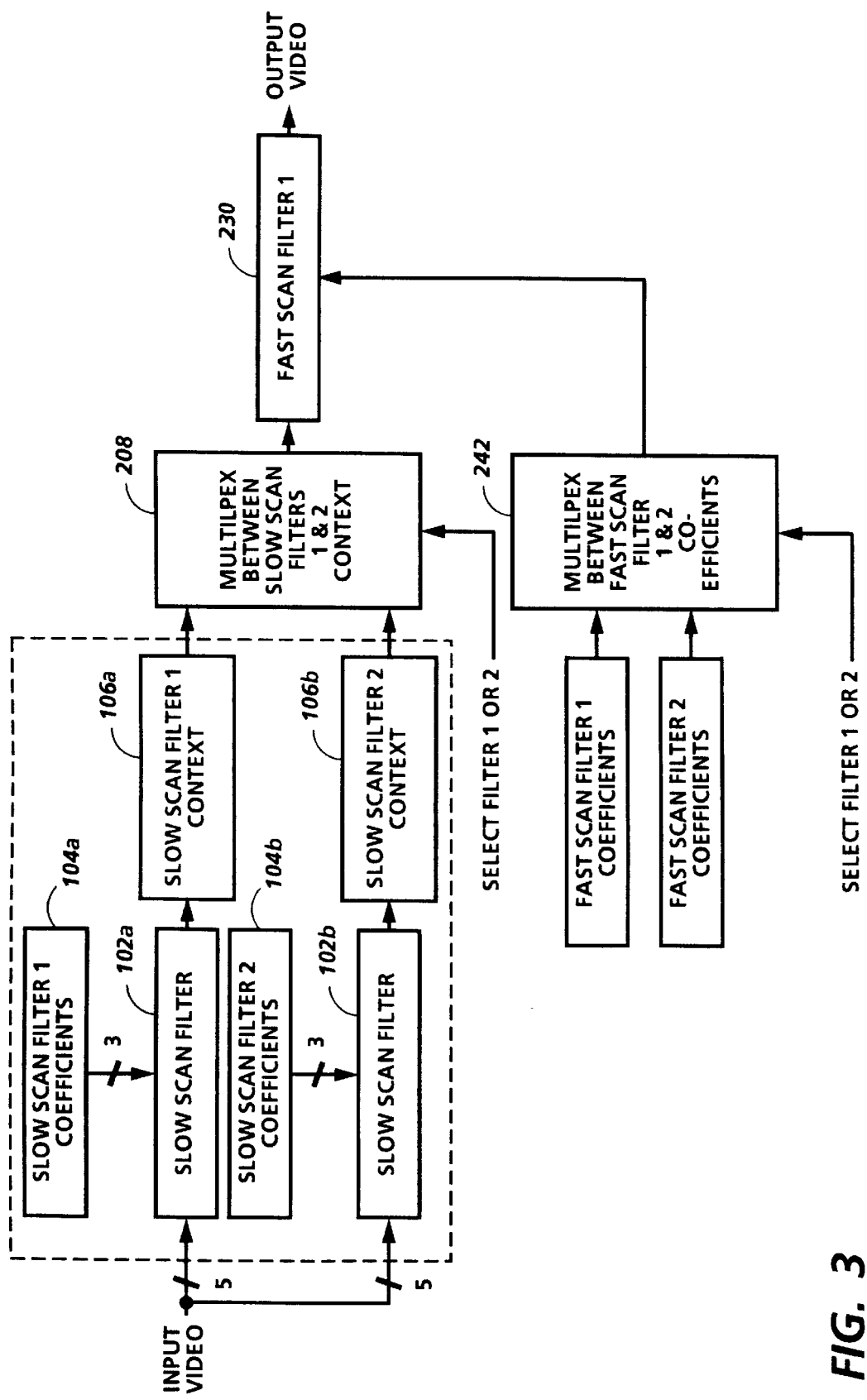
FIG. 3 is a block diagram illustrating the reduced hardware component set used in the present invention for implementation of a pair of two-dimensional filters.

FIG. 3, in conjunction with FIGS. 4A, 4B, 5, and 6, illustrates the hardware of the two-dimensional filter of the present invention. The hardware provides two independent five scanline by fifteen pixel finite impulse response (FIR), or convolution filters. Each filter allows for the use of a center pixel adjust coefficient, although filter coefficients must be symmetrical in both the fast and slow scan directions. The filter coefficients are programmable and may be set to zero to employ the use of a filter size smaller than 5×15. As previously described, the CPU may be utilized to program the operation of the filter to switch between filters or bypass them completely on a pixel by pixel basis.

Each filter processes five input scanlines at a time, pixel by pixel, to calculate each output scanline. As previously described with respect to FIG. 1, input scanlines must be buffered in line buffer 38 to meet the filter input requirements. In addition, if two-dimensional filter 34 is used with segmentation block 30 of FIG. 1, the filter must operate one scanline later than the segmentation block. The two-dimensional convolution carried out by two-dimensional filter 34 may be expressed by the following equation:

$$F(x, y) = \sum_{m}\sum_{n} h(m, n)g(x - m, y - n), \quad \text{(eq. 1)}$$

where m and n represent the two convolution dimensions. The two-dimensional filter implements the two-dimensional convolution under the condition that it is separable. Hence, the two-dimensional convolution of equation 1 may be expressed, as shown in equation 4, in terms of the following two one-dimensional convolutions (eq. 2, 3):

$$a(x, y) = \sum_{m=-2}^{2} h_1(m) Pix(x + m, y), \text{ and} \quad \text{(eq.2)}$$

$$g(x, y) = \sum_{n=-7}^{7} h_2(n) a(x, y + n) \quad \text{(eq. 3)}$$

where Pix(i,j) represents the input pixel values, and $$F(x,y) = g(x,y) + Pix(x,y)hc \quad \text{(eq. 4)}$$

Referring now to FIGS. 3 through 6, which illustrate the reduced hardware implementation of the two-dimensional filter, input video is provided to slow scan filters 102a and 102b from line buffer memory 38 of FIG. 1. Also provided to filters 102a and 102b are the associated slow scan filter coefficients, as contained in slow scan filter coefficient memory 104a and 104b, respectively. The slow scan filter coefficients are represented by the letters:

ABCBA arranged in a symmetric fashion about the center scanline coefficient C. The output of slow scan filters 102a and 102b is directed to slow scan filter context buffers 106a and 106b respectively. As further illustrated in FIG. 4A, slow scan filters 102a,b are actually implemented by identical hardware circuits and subsequently employ a multiplexed context switch, 208, to select the output from one of the two slow scan filters.

Figure 4A:
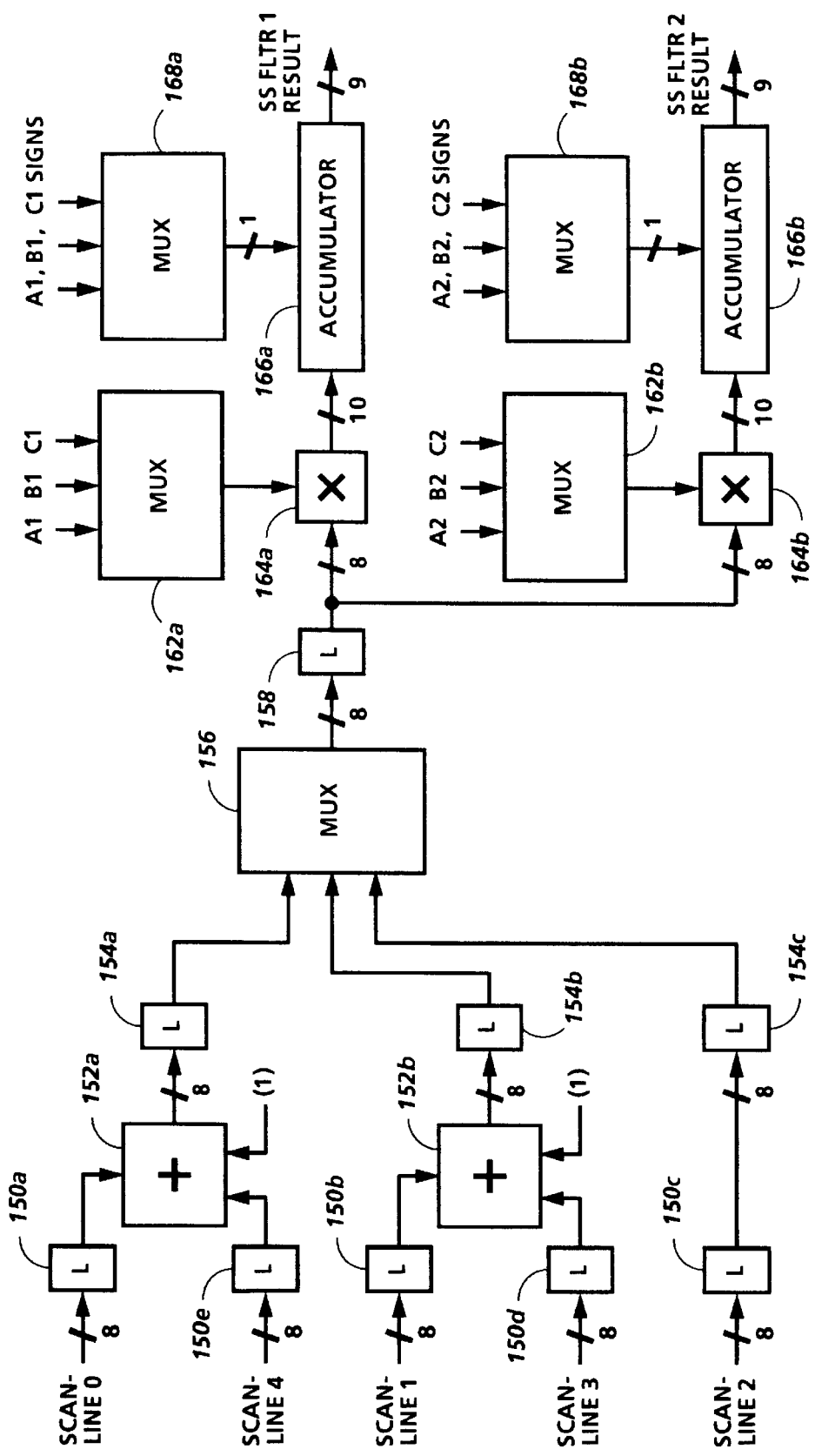
FIGS. 4A and 4B are more detailed illustrations of the hardware components used to implement the slow scan filters of FIG. 3.
Figure 4B:
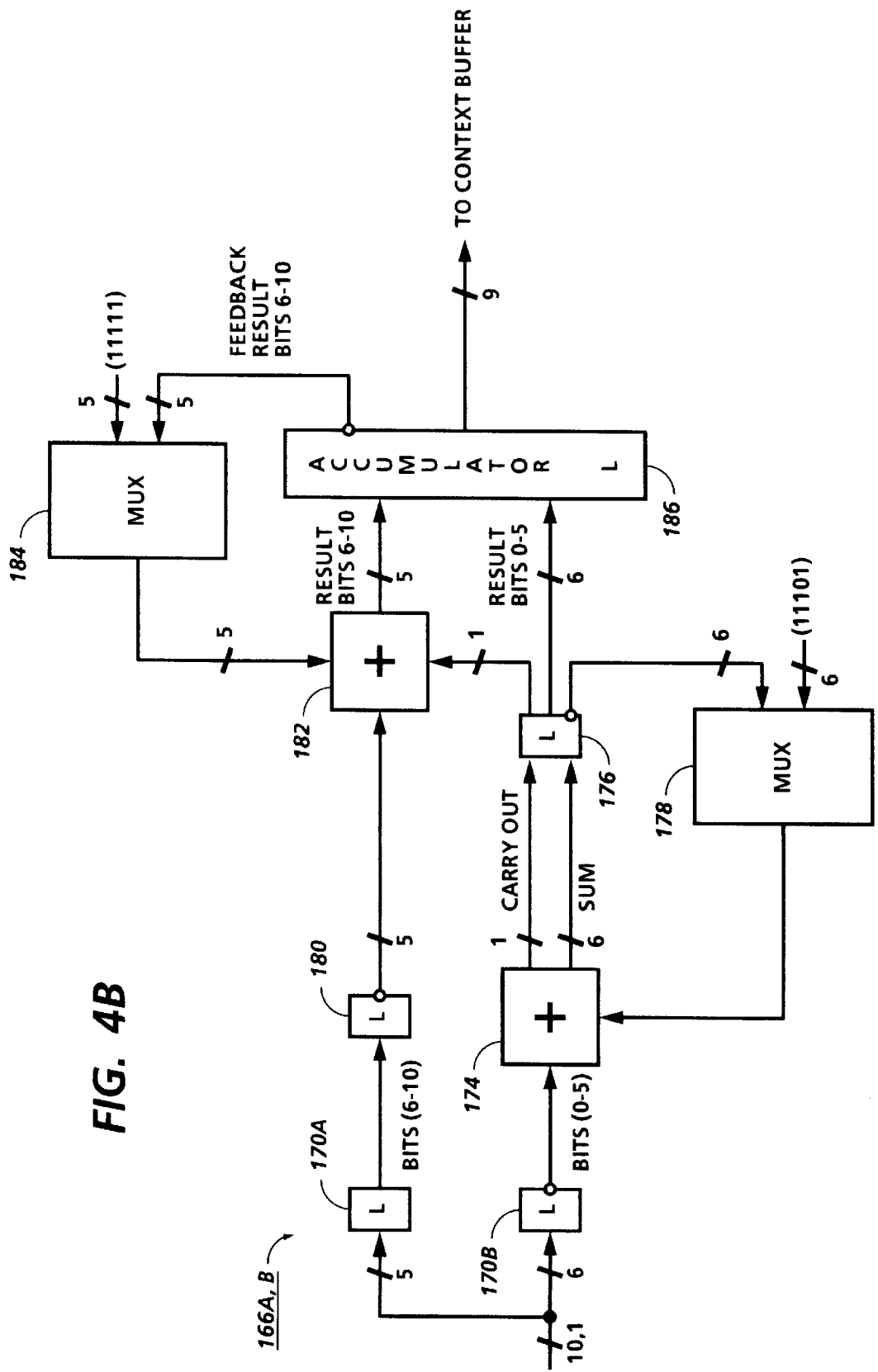

Referring now to FIGS. 4A and 4B, which depict the first stage or slow scan filter hardware blocks, digital pixel data from the five scanlines or rasters (scanlines 0–5) is first latched at latches 150a, 150b, 150c, 150d, and 150e. The data latches for the outermost scanlines are paired with the mirror image scanline, for example, scanlines 0 and 4, and subsequently added at adders 152a,b. After summing the symmetrical scanlines, the results are again latched, latches 154a,b,c, and held for selection by multiplexer 156. Multiplexer 156 sequentially selects the results from latches 154a, 154b, and 154c, passing them to latch 158, where the values are retrieved for multiplication with their respective coefficients. For example, coefficients $A_1$, $B_j$, $C_1$, output from coefficient multiplexer 162a, would be sequentially multiplied with the values in latch 158 by multiplier 164a, thereby producing a 10-bit product which is passed to accumulator 166a.

As illustrated in FIG. 4B, accumulator 166a receives the 10-bit product from multiplier 164a, and in combination with the signs of the respective coefficients, accumulates the total of the multiplication products. More specifically, accumulator 166a initially latches the incoming 10-bit product and the 1-bit sign value from multiplexer 168a in latches 170a,b. Because the accumulate requires an 11-bit add operation, the latches are used to allow breaking of the addition operation into two separate add/latch/feedback functions. For example, lower adder 174 first adds the inverted, lower six bits of the incoming value (00010) provided from lower multiplexer 178 thereby producing a rounded 6-bit input value which is then saved in lower latch 176 and the lower six bits of the accumulator. Next, upper adder 182 receives the upper five bits of the input value from latch 180 and adds that to a zero value first received from upper multiplexer 184 and the carry out value received from the uppermost bit of lower latch 176, thereby producing a 5-bit result which is stored in the upper five bits of accumulator latch 186. Once the cycle is completed, it is repeated two more times using the latched adder results from the previous addition cycle to enable the addition/accumulation of the three slow scan filter output values. Subsequent to completing the three accumulation steps, the upper nine bits of the accumulator, the rounded result, is output to the fast scan context buffer, buffer 200a. Similarly, accumulator 166b would be operating concurrently on the outputs of multiplier 164b and multiplexer 168b to accumulate the result for the second slow scan filter.

As is apparent from the description of the slow scan filter, and the accompanying accumulator, the afore-described hardware must be suitable for running at or greater than three times the input video rate in order to complete the generation of the filter context for each pixel before a subsequent pixel signal arrives. The multiplying, adding, and accumulating operations inherent in the present filter have been designed to optimize the performance of the filter in just such a situation. Accordingly, the present slow scan filter design has been implemented as part of an application specific integrated circuit, and has been tested for performance at input data rates up to fifteen megahertz. Alternative designs for the slow scan filter are surely possible given a different set of timing constraints.

Figure 5:
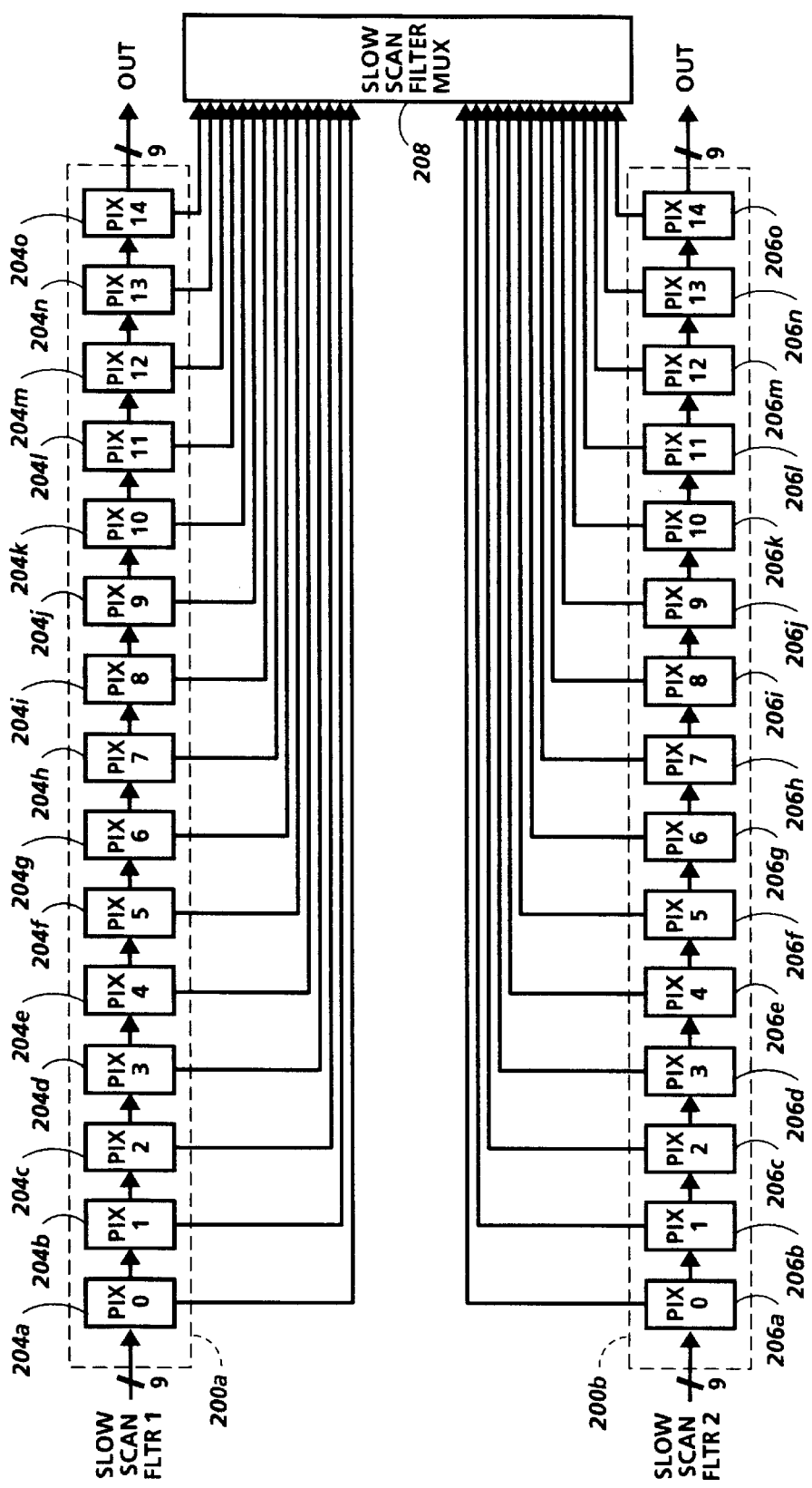
FIG. 5 is a detailed representation of the context storage buffer for the pair of slow scan filters of FIG. 4A.

Turning now to FIG. 5, once the pixels are filtered with respect to the slow scan context, the resultant slow scan output values are accumulated in respective fast scan context buffers 200a and 200b. The context buffers are arrays of fifteen parallel latches, 204a–204o and 206a–206o, placed in sequence. These buffers provide the functionality necessary for the individual 9-bit output values to be passed to the fast scan filter, as well as, shifting of the stored values to subsequent latches. For example, a filtered pixel value entering context buffer 200a would first be stored in latch 204a where it would be used as the pix0 input to the fast scan filter of FIG. 6. On a subsequent pixel clock, the value of the subject filtered pixel would be transferred from latch 204a to latch 204b, where it would be used as pix1 input to the fast scan filter. Likewise, the subject filtered pixel value would be shifted, on subsequent pixel clocks, through context buffer 200a until it was shifted out the end after latch 204o. Selection of the context passed to fast scan filter 230 is determined by the selection line controlling slow scan multiplexer 208, selecting between the context from slow scan filter 1, 200a, or slow scan filter 2, 200b. The selection line is controlled by the CPU, or other image processing window control, based upon the filtering option desired for the pixel currently being processed. Slow scan multiplexer 208 may also be used to control the selection of the fast scan filter coefficients, including the coefficient signs, in the same manner in which it controls the selection of the filter context. Thus a larger multiplexer may be used to simultaneously select the desired slow scan filter context and their associated fast scan filter coefficients.

Figure 6:
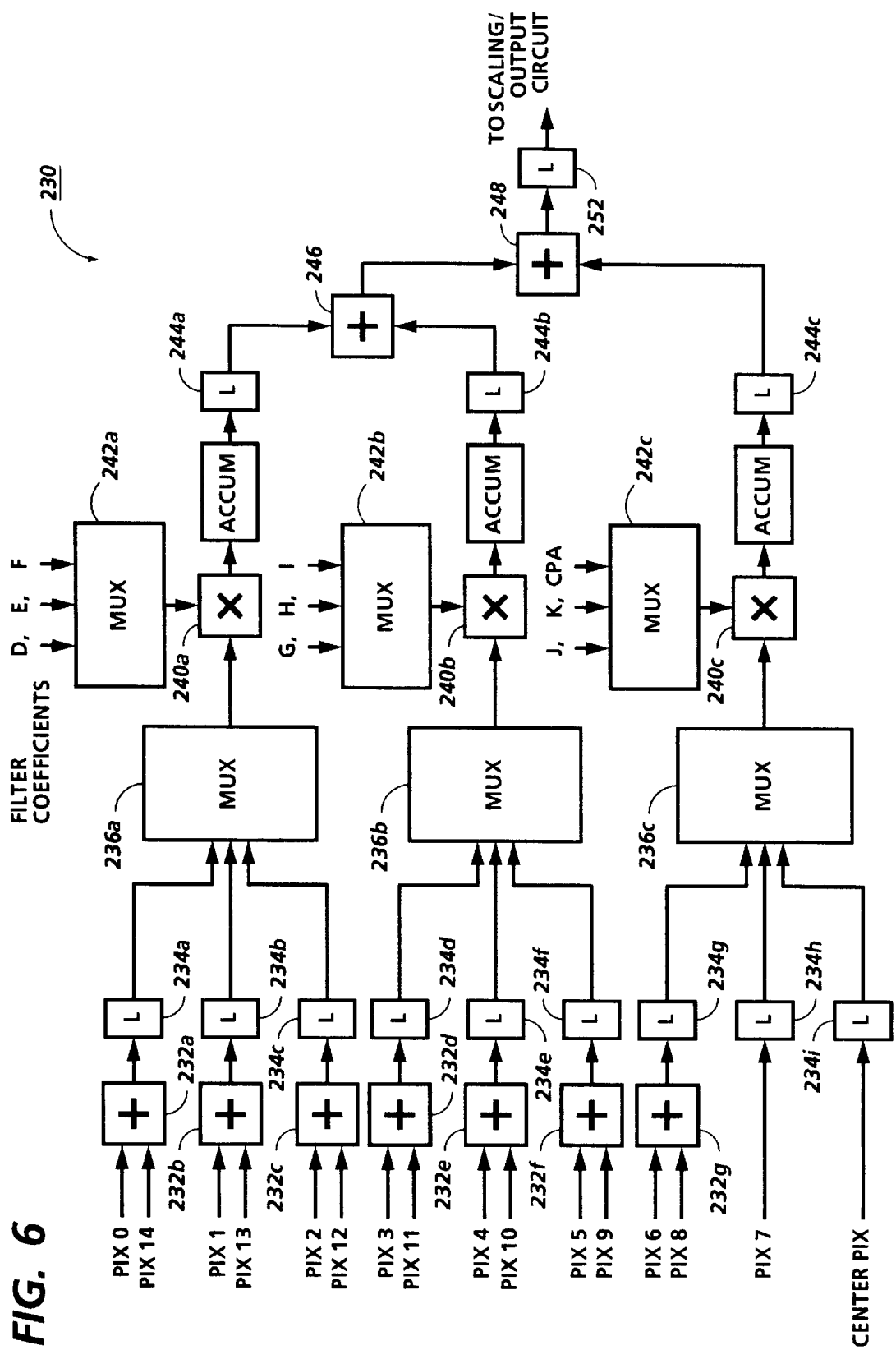
FIG. 6 is an illustration of the hardware components used to implement the single fast scan filter of FIG. 3.

Referring now to FIG. 6, which illustrates the second stage or fast scan filter architecture, fast scan filter 230 initially receives the required slow scan filter output via the multiplexed context buffers 200a or 200b. Initially, fast scan filter 230 pairs the slow scan filter output from symmetric pixels (i.e., pix0 and pix14, or pix3 and pix11) and adds the symmetric values at adders 232a–232g. Like the slow scan filter, the fast scan filter combines coefficient symmetry along with a 3× speed increase in multiplier speed (each multiplier runs at 3 times the pixel clock rate) to reduce the overall hardware size. Due to this symmetry, terms of like coefficients can be combined to reduce the number of hardware elements. This, coupled with the use of a single fast scan filter saves considerable ASIC die space, and therefore cost, even with the addition of the required multiplexing circuitry.

Subsequent to the addition operation, the pixel sums are stored in latches 234a–234g, respectively. An additional latch, 234h is used to store the value of pix7, the center value in the slow scan filter context. Another latch is used, latch 234i, to store the actual value of the center or target pixel, which has been moved in sequence with the pix7 filtered pixel value through the previous filtering operations. The intent of including the buffered center pixel, as well as the Center Pixel Adjust (CPA) coefficient, is to enable their subsequent multiplication and addition to the final filtered result, as done in an enhancement type filter.

The fast scan filter coefficients are represented by the letters:

DEFGHIJKJIHGFED and are multiplied by the the associated pixel sums. Considering the pixel values for pix1 and pix13, for example, the sum of the two values is stored in latch 234b until passed to multiplier 240a via multiplexer 236a on the second of three multiply/accumulate cycles. The sum of pix1 and pix13 is multiplied by coefficient E, provided via coefficient multiplexer 242a, and then stored in latch 244a. Subsequently, the value stored in latch 244a [(pix1+pix13)*E] is added to the value stored in latch 244b [(pix4+pix10)*H] by adder 246. The sum at adder 246 is then added to the value of latch 244c [pix7*K] at adder 248, the resulting sum being stored in latch 252. In a similar fashion, all of the remaining pixel pairs would be multiplied by their associated coefficients.

Subsequent to executing the multiplication and addition operations, as illustrated in FIG. 6, the value stored in latch 252 is scaled and checked for overflow in accordance with the scale factor determined for the filter coefficients being used. Scaling depends upon the magnitude of the input coefficients chosen for use in the filter. Briefly, the sum of the absolute value of the slow scan coefficients must be less than or equal to one, and the sum of the absolute value of the fast scan and center pixel adjust coefficients must also be less than or equal to one. If these conditions are initially met, then the scale factor is one. If these conditions are not met, then all coefficients must be divided by 2 or 4 in order to meet the requirements. In essence, the scale factor determines which eight bits of the 10-bit filtered result contained in latch 252 are the final filter output. The selection of the valid bits results in some truncation error, which, given the appropriate input image may be discernible in an output image. However, the noise present in most documents and imaging systems generally allows the truncation error to remain undetected.

Overflow checking is required because the filtered result contained in latch 252 is greater than an 8-bit value. Hence, overflow checking ensures that the filter output will be set to the maximum (FF hex) when appropriate, in accordance with the actual filtered result and the coefficient scale factor. In addition, underflow checking is required due to the potential use of negative filter coefficients. The underflow checking ensures that a negative filter result will be output as zero (00 hex). After the scaling, or the selection and truncation operations, the resulting 8-bit filtered pixel value is output.

In a typical image processing implementation, one filter may be programmed as a low pass filter to remove screen patterns in halftone originals, while the other filter could be programmed as an edge enhancement filter to improve fine line and character reproduction when thresholding. Operating the two-dimensional filter of the present application in conjunction with the halftone detection capabilities of the image segmentation block described in FIG. 1 would then allow the automatic selection of the appropriate filters during the processing of data. Thus, enabling the accurate and automatic processing of image signals generated from original documents having halftone images interspersed within text.

In an alternative embodiment, the two-dimensional filter of the present invention may be implemented in software, employing the steps of the afore-described hardware implementation. The software embodiment described herein was used to verify the operation of the ASIC device, however, the embodiment may be utilized to implement the functionality of a two-dimensional digital filter from two one-dimensional transformations. Further description of the software implementation will include specific references to relevant portions of the two-dimensional filter simulation code included in Appendices A and B.

Figure 7A:
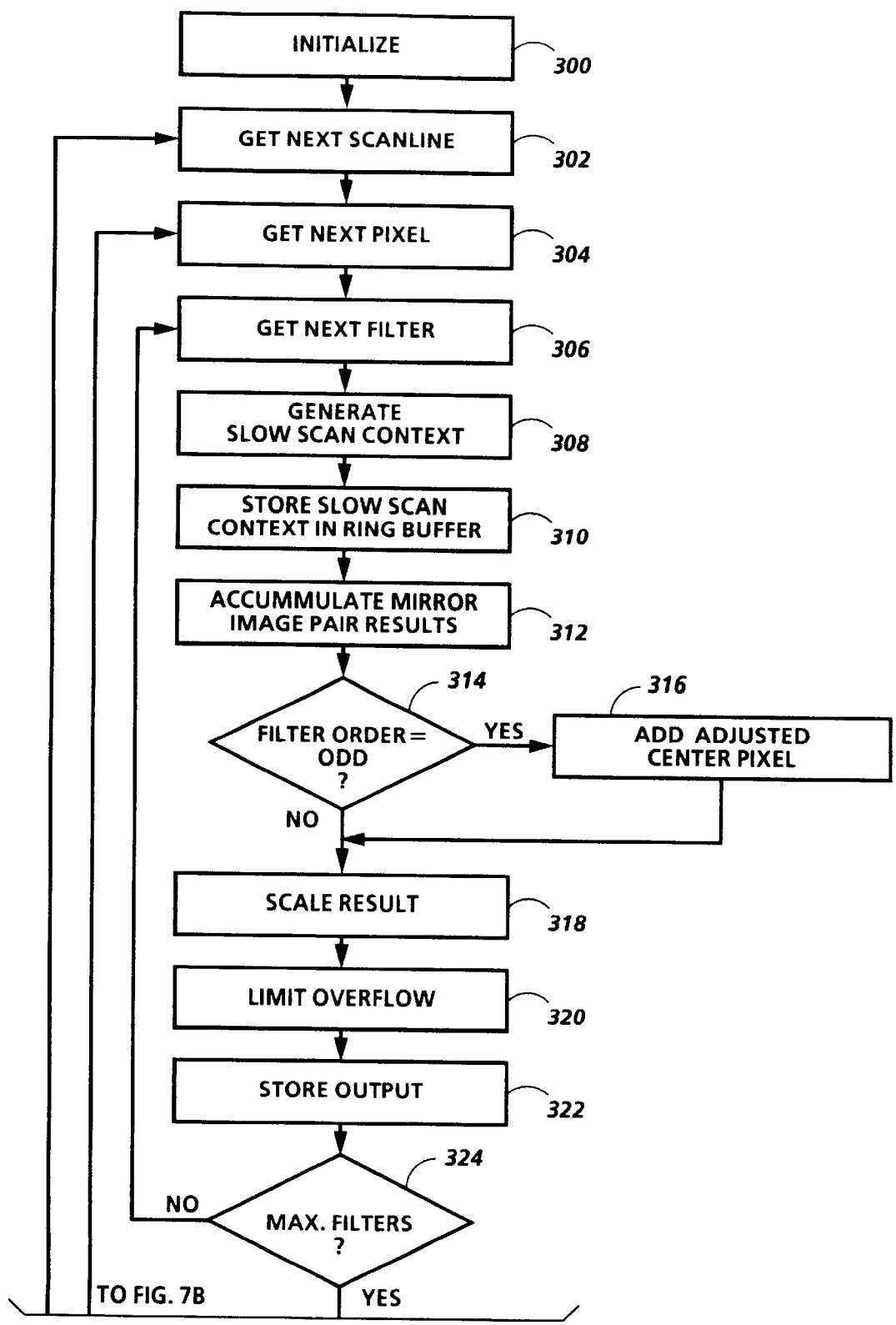
FIGS. 7A and 7B are flow diagrams illustrating the equivalent steps associated with the operation of the two-dimensional filters of the present invention.
Figure 7B:
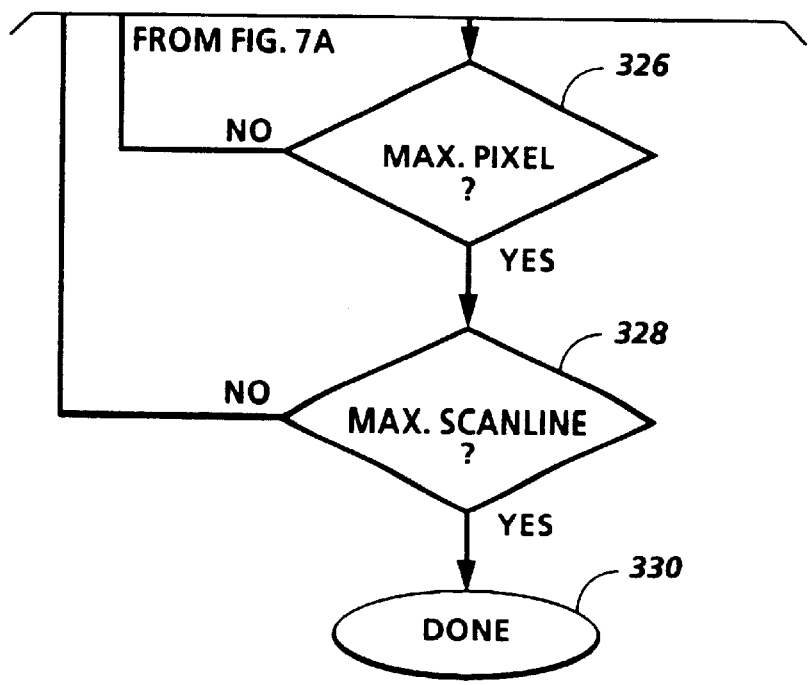

Referring now to FIG. 7A and 7B which is a flowchart showing the processing steps used to simulate the two-dimensional filtering operations of the present invention in software, the process begins with initialization step 300. In general, initialization might include the reading of the filter coefficients, allocation of memory in accordance with the size of the filter, opening and establishment of file pointers and additional initialization of variables. For instance, the software embodiment of the two-dimensional filter also builds a look-up table of possible multiplication products for the coefficients input to the system (see sopfilter( ),Appendix A p.22). The look-up table implementation is more efficient for execution of the numerous multiplication steps necessary in the filtering of the digital input image.

Continuing at step 302, the system would retrieve the next, or in this case, first, scanline of image data. From this scanline, the system would sequentially process, or filter, each pixel within the line via the get next pixel step, step 304. As illustrated in Appendix A, the processing of pixels is controlled by the first for loop in the gfilter ( ) function (Appendix A, p. 23). In order to efficiently process values for more than one two-dimensional filter, the software would also include a filter loop, as controlled by step 306 in conjunction with decision step 324. It should be noted that, as with the hardware embodiment, no filtering is begun until there are sufficient pixels to establish context for both the slow scan and fast scan portions of the filter. More specifically, the "get next filter loop" would execute enclosed steps 308 through 322 for each filter to be run in software. In practice, the use of additional filters will cause an increase in the processing time required to complete the filtering operation.

Next, step 308 generates the slow scan filter context using pixel values from five or fewer scanlines, by adding the values of the symmetric pixels which lie in the four scanlines immediately adjacent the scanline currently being processed. As illustrated in Appendix A, page 24, the slow scan context is generated by sequentially adding the symmetric pixels, multiplying them by the respective coefficients, and temporarily storing the sum in the itmp variable. Here, as well as in the generation of the fast scan filter context, the multiplication of the coefficient values is most efficiently executed through the use of the multiplication look-up tables which were generated in initialization step 300. Once the context has been established for a target pixel, it is stored in a ring type buffer, step 310. The ring buffer is used as an expedient method of carrying out the operation of the context buffer of FIG. 5.

After the ring buffer has sufficient context to support the fast scan filter, the process continues at step 312, where the symmetric, or mirror image, pixel pairs are summed, multiplied by their respective fast scan filter coefficients, and accumulated to produce the following result:

$$\text{sum}=(pix0+pix14)*D+(pix1+pix13)*E+(pix2+pix12)*F+(pix3+pix1)*G+(pix4+pix10)*H+(pix5+pix9)*I+(pix6+pix8)*J+pix7*K.$$

Implementation of the addition, multiplication, and accumulation operations are detailed on page 24 of Appendix A in the second for loop which uses k as the control variable. As shown in the equation above, the center pixel addition is controlled by the test at step 314. If the filter order is odd, meaning that there is a center pixel, pix7 is multiplied by center pixel coefficient K in step 316. Additionally, as in the hardware embodiment, an adjusted center pixel value may also be added to the accumulated filter sum at this point. Following the accumulation of interim fast scan filter values, the final sum is then scaled at step 318, in accordance with the user selectable scale factor and deter mined based upon the actual two-dimensional filter coefficient used. More specifically, a case statement is used within the gfilter ( ) function to determine the scale factor, and shift right the accumulated filter result by the appropriate amount.

Next, the scaled, or shifted, filter result is checked to determine if overflow or underflow conditions exists, at step 320, prior to being stored in step 322. Should an overflow or underflow (negative) filter result be detected, the value stored will be set to the maximum or minimum filter out put value, respectively. After storage of the two-dimensional filtered pixel value, test steps 324, 326 and 328 are executed to determine if and where further processing is to be continued. In one embodiment, these test operations may be executed as part of a loop-type control structure, for example, the f or loop structure used in the software of Appendix A. Upon successful completion of the two-dimensional filtering of all pixels within the image, control would be returned to the calling or parent function for further processing, display, or printing of the filtered output image.

In recapitulation, the present invention implements a two-dimensional digital filter using two one-dimensional transformations. The two-dimensional filtering method and apparatus of the present invention enable the efficient processing of digital image data, so as to increase processing efficiency and reduce the costs of any associated hardware.

It is, therefore, apparent that there has been provided in accordance with the present invention, a two-dimensional digital finite impulse response filter that fully satisfies the aims and advantages hereinbefore set forth. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

Appendix A

```
/****************************************************************
Copyright (c) 1989 Xerox Corporation. All Rights Reserved.
Copyright protection claimed include all forms and matters
of copyrightable material and information now allowed by
statutory or judicial law or hereafter granted, including
without limitation, material generated from the software
programs which are displayed on the screen such as icons,
screen display looks, etc.
****************************************************************/
/* filter.c
 *
 * Module: filter.c
 * Author: Leon C. Williams, Jeng-nan Shiau.
 *
 * Description: This module provides simulation of the 2D filter chip.
 *
 * Procedures:
 * filter(): parse the filter specification;
 * pfilter(): open the file and read in the filter coefficients.
 * rfilter(): report the coefficients read in.
 * gfilter(): carry out the 2D filter computation on filter enabled pixels.
 */ extern char *vbasename;      /* the simulation vector files basename */ include <stdio.h>
include <unistd.h>
#include <malloc.h>
#include <memory.h>
#include <string.h>
#include <math.h>
#include "object.h"
#include "types.h"      /* program specific type declarations */
#include "limits.h"     /* programmable specification ranges */
#include "effects.h"    /* the window effects structure */
#include "base.h"       /* address of registers for vectors */
include "y.tab.h"      /* contains token ID for lex */ define CONV_LIN 5              /* height of the convolution mask */
define CONV_PIX 15             /* width of the convolution mask */ define STAGESIZE 16            /* this MUST be the next higher power of two */
define STAGEMASK (STAGESIZE-1) /* greater or equal to CONV_PIX (ring buffer)*/ define MAX_COEFF 255   /* limit the coefficient ranges */
define MIN_COEFF -256 static int ss_len[MAX_FILTER];                      /* size of ss conv */
static int fs_len[MAX_FILTER];                      /* size of fs conv */
static int istage[MAX_FILTER][STAGESIZE];           /* ring buffer */
static int isscoef[MAX_FILTER][(CONV_LIN + 1)/2];       /* ss coefficients */
static int ifscoef[MAX_FILTER][(CONV_PIX + 1)/2];       /* fs coefficients */
static int icpcoef[MAX_FILTER];                     /* center coefficients */
static int scanlines, pixels;
```

Appendix A

```
static int pmfast[MAX_FILTER][(CONV_PIX + 1)/2][MAX_COEFF + 1];  /* premultiply table */
static int pmslow[MAX_FILTER][(CONV_LIN + 1)/2][MAX_COEFF + 1];  /* premultiply table */
static int pmcenter[MAX_FILTER][MAX_COEFF + 1];        /* premultiply table */ extern unsigned char *scanbuf[];
define name Filter.myname
static char *file[MAX_FILTER] = {NULL,NULL};

static char *err_mesg[] =
    {
    "'%s' specified selector #%d invalid.\n",
    "'%s' ignorning unknown specifier '%s'.\n",
    "'%s' can't open File = '%s'.\n",
    "'%s' insufficient data in File = '%s'.\n",
    "'%s' width must be less than %d.\n",
    "'%s' height must be less than %d.\n",
    };
/****************************************************************
filter ----- parse the specifications after the filter keyword
****************************************************************/
filter(select,nspecs,sa)
int select;
int nspecs;
SPECS *sa;
{
int i;

if(select > MAX_FILTER){
        pperror(err_mesg[0], name, select);
        return;
    } for(i = 0;i<nspecs;i++){
        if(!stricmp(sa[i].id,"FILE")){
            if(get_string(sa + i,name) == ERROR)
                continue;
            file[select-1] = malloc(strlen(sa[i].value.pval) + 1);
            strcpy(file[select-1],sa[i].value.pval);
        } else {
            ppwarn(err_mesg[1],name,sa[i].id);
            continue;
        }
    }
}

/****************************************************************
pfilter ----- error checking after all specs are in
****************************************************************/
pfilter()
{
    int i, j, k;
    FILE *fileh;
    float ftmp;
```

Appendix A

```
for(i = 0; i<MAX_FILTER; i++){
    if(file[i])  {
        if(!(fileh = fopen(file[i],"r"))) {
            pperror(err_mesg[2],name,file[i]);
            return;
        }
        /* read filter length in fast scan and slow scan */
        if(get_num(fileh,file[i],&fs_len[i]) == ERROR)
            continue;
        if(fs_len[i] > CONV_PIX ){
            pperror(err_mesg[4],name,CONV_PIX);
            continue;
        }
        if(get_num(fileh,file[i],&ss_len[i]) == ERROR)
            continue;
        if(ss_len[i] > CONV_LIN ){
            pperror(err_mesg[5],name,CONV_LIN);
            continue;
        }

/* read fast scan coefficients */
        for(j = 0; j<(fs_len[i] + 1)/2; ++j){
            if(fscanf(fileh,"%f",&ftmp)! = 1){
                pperror(err_mesg[3],name,file[i]);
                fclose(fileh);
                return;
            }
            k = ftmp * 256;
            if( k > 255 )
                k = 255;
            ifscoef[i][(CONV_PIX + 1)/2-(fs_len[i] + 1)/2 + j] = k;
        }

/* read slow scan coefficients */
        for(j = 0; j<(ss_len[i] + 1)/2; ++j){
            if(fscanf(fileh,"%f",&ftmp)! = 1){
                pperror(err_mesg[3],name,file[i]);
                fclose(fileh);
                return;
            }
            k = ftmp * 256;
            if( k > 255 )
                k = 255;
            isscoef[i][(CONV_LIN + 1)/2-(ss_len[i] + 1)/2 + j] = k;
        }

/* read cpcoef */
        if(fscanf(fileh,"%f",&ftmp)! = 1){
            pperror(err_mesg[3],name,file[i]);
            fclose(fileh);
            return;
        }
        k = ftmp * 256;
        if( k > 255 )
```

Appendix A

```
            k = 255;
        icpcoef[i] = k;

fclose(fileh);
      }
    }
}
/***********************************************************************
rfilter ----- issue report file
***********************************************************************/
rfilter(report)
FILE *report;
{
    int i, j;

/* issue report of value read in */
    for(i = 0; i < MAX_FILTER; i + +)
        if(file[i])   {
            fprintf(report,"\n%s #%d File = %s ",name,i + 1,file[i]);
            fprintf(report,"/\t FastScanLength = %5d SlowScanLength = %5d",
                fs_len[i],ss_len[i]);
            for(j = 0; j < (fs_len[i] + 1)/2; j + +) {
                if(!(j%8)) fprintf(report,"\n//");
                    fprintf(report,"\t%5d",ifscoef[i][(CONV_PIX + 1)/2-(fs_len[i] + 1)/2 + j]);
            }
            for(j = 0; j < (ss_len[i] + 1)/2; j + +) {
                if(!(j%8)) fprintf(report,"\n//");
                    fprintf(report,"\t%5d",isscoef[i][(CONV_LIN + 1)/2-(ss_len[i] + 1)/2 + j]);
            }
            fprintf(report,"\n/\t CenterPixel = %5d\n",icpcoef[i]);
        }
}
/***********************************************************************
vfilter ----- program test vectors
***********************************************************************/
vfilter()
{
    /* no vectors are required for this example */
}
/***********************************************************************
sopfilter ----- called before a page starts
***********************************************************************/
sopfilter(scan,pix)
int scan, pix;
{
    int i, j, k;

/* record image size for future use */
    scanlines = scan;
    pixels = pix;
    /* for efficiency, build a table lookup for speed */
    for(i = 0;i < MAX_FILTER;i + +){
        /* if no coefficients for this filter, continue */
        if(!file[i])
```

Appendix A

```
                continue;
        /* for all fast-scan coefficients, and all input values, compute mpy */
        for(j = 0;j<(CONV_PIX + 1)/2;j + +)
            for(k = 0;k<MAX_COEFF + 1;k + +)
                pmfast[i][j][k] = ifscoef[i][j]*k;
        /* for all slow-scan coefficients, and all input values, compute mpy */
        for(j = 0;j<(CONV_LIN + 1)/2;j + +)
            for(k = 0;k<MAX_COEFF + 1;k + +)
                pmslow[i][j][k] = isscoef[i][j]*k;
        /* for all center coefficients, and all input values, compute mpy */
        for(k = 0;k<MAX_COEFF + 1;k + +)
            pmcenter[i][k] = icpcoef[i]*k;
    }
}
/***********************************************************************
solfilter ----- called before a line starts
***********************************************************************/
solfilter(scan)
int scan;
{
    /* no specific actions required at start of scanline */
}

/***********************************************************************
gfilter ----- run the filter(s) over 1 scanline of the image
***********************************************************************/
gfilter(line)
IMAGELINE *line;
{
    int i,j,k;
    int itmp, temp;
    double dsum;
    unsigned char *stemp;

/* test fo convolution mask on image, if not, don't filter line */
    if(line->scanno < CONV_LIN/2 || line->scanno > = scanlines - CONV_LIN/2)
        return;
    /* for all pixels in the line... */
    for(i = 0;i<line->pixels;i + +){
        /* for all possible filters... */
        for(j = 0;j<MAX_FILTER;j + +){
            /* if no coefficients for this filter, don't process */
            if(!file[j])
                continue;
            /* separable convolution - do slow scan filter */
            itmp = 0;
            for(k = 0;k<CONV_LIN/2;k + +){
                temp = (scanbuf[k][i] + scanbuf[CONV_LIN-k-1][i] + 1)>>1;
                itmp + = pmslow[j][k][temp];
            }
            /* if filter order is odd, do center pixel */
            if( CONV_LIN & 1 )
                itmp + = pmslow[j][k][scanbuf[k][i]];
```

Appendix A

```
            istage[j][i&STAGEMASK] = (itmp + 2)>>2;

/* test fo convolution mask on image, if not, don't filter pixel */
            if(i<CONV_PIX-1)
                continue;

/* if this filter not required for this pixel, don't compute */
            if(line->tag.eline[i-CONV_PIX/2].filter != j+1)
                continue;

/* separable convolution - do fast scan filter */
            itmp = 0;
            for(k = 0;k<CONV_PIX/2;k++){
                temp = (istage[j][(i-CONV_PIX+1+k)&STAGEMASK] +
                    istage[j][((i-k)&STAGEMASK] + 1)>>1;
                if(temp>=0)
                    itmp += pmfast[j][k][temp];
                else
                    itmp -= pmfast[j][k][-temp];
            }

/* if filter order is odd, do center pixel */
            if( CONV_PIX & 1 ){
                temp = istage[j][(i-k)&STAGEMASK];
                if(temp>=0)
                    itmp += pmfast[j][k][temp];
                else
                    itmp -= pmfast[j][k][-temp];
            }

/* do center pixel adjust computation */
            itmp += pmcenter[j][line->iline[i-CONV_PIX/2]];

/* detect overflow or underflow conditions */
            if(itmp > MAX_VIDEO)
                itmp = MAX_VIDEO;
            if(itmp < MIN_VIDEO)
                itmp = MIN_VIDEO;

/* replace input pixel with filtered pixel */
            line->iline[i-CONV_PIX/2] = itmp;
        }
    }
}
SimObject Filter =
{
  "Filter",
  TIMESTAMP,
    FILTER,
  NullProc,
  NullProc,
  filter,
  pfilter,
  vfilter,
```

Appendix A

```
        NullProc,
        sopfilter,
        solfilter,
        gfilter,
        NullProc,
        NullProc,
        rfilter,
        NullProc,
        NullProc,
        NullProc,
};;
```

Appendix B

```c
/***********************************************************************
Copyright (c) 1989 Xerox Corporation. All Rights Reserved.
Copyright protection claimed include all forms and matters
of copyrightable material and information now allowed by
statutory or judicial law or hereafter granted, including
without limitation, material generated from the software
programs which are displayed on the screen such as icons,
screen display looks, etc.
***********************************************************************/
/*  effects.h
 *
 * Module: effects.h
 * Author: Leon C. Williams
 *
 * Description:
 *     This module defines the effects structure used in the 1D chip.
 */ define CROP_MAX 1
define CROP_MIN 2
define CROP_STIPPLE 3 typedef struct _effects {
    unsigned dynamic:1;         /* DynamicRange selection ID */
    unsigned trc:1;             /* TrcMapping selection ID */
    unsigned crop:2;            /* Cropping selection ID */
    unsigned moire:1;           /* MoireAway selection ID */
    unsigned binary:2;          /* Screen/Threshold selection ID */
    unsigned inversion:1;       /* Inversion enable */
    unsigned suppression:1;     /* Supression enable */
    unsigned filter:2;          /* Filter selection ID */
    unsigned segmentation:2;    /* Segmentation enable/class */
} EFFECTS;

typedef struct
{
    int pixels;
    int scanno;
    int bytes;
    unsigned char *iline;
    union {
        int *region;
        EFFECTS *eline;
    } tag;
} IMAGELINE;

#define IMAGELINEBUF 16 /* amount added to line malloc's for EOL process */
```

Appendix B

```
/******************************************************************
Copyright (c) 1989 Xerox Corporation. All Rights Reserved.
Copyright protection claimed include all forms and matters
of copyrightable material and information now allowed by
statutory or judicial law or hereafter granted, including
without limitation, material generated from the software
programs which are displayed on the screen such as icons,
screen display looks, etc.
******************************************************************/
/* limits.h
 *
 * Module: limits.h
 * Author: Leon C. Williams
 *
 * Description:
 *     This module defines the limits (or ranges) of values for the
 *     programmable registers of the 1D chip.
 *
 */ define MAX_VIDEO           255
define MIN_VIDEO           0 define MAX_STIPPLEVALUE    1 define MAX_SCREENCELL      2
define MAX_SCREENGRAY      64
#define MAX_SCREENBINARY    256
define MAX_SCREENLEVEL     16 define MAX_THRESHOLD       2
define MAX_THRESHBREAK     1 define MAX_TRCMAPPING      1 define MAX_DYNAMICRANGE    1
define MIN_DYNAMICGAIN     0.0
#define MAX_DYNAMICGAIN         15.984375
#define MIN_DYNAMICOFF      -128
define MAX_DYNAMICOFF      127 define MAX_MOIREAWAY       1
define MAX_MOIREGAIN       1.0
define MIN_MOIREGAIN    0.0 define MAX_WINDOW          17
define MIN_WINDOWSIZE      0
#define MAX_WINDOWSIZE      ((1<<15)-1) + (1<<15)
define MAX_WINDOWTILE      32 define MAX_SCALEFACTOR     3.0
define MIN_SCALEFACTOR     0.03126 /* 1/31.99996948 */ define MAX_FILTER          2
```

28

Appendix B

```
#define MAX_LEFT       4064
#define MAX_BKGWIDTH   4064
#define MAX_TOP        4095
define MAX_BKGHEIGHT  63 define MAX_WY         48
define MAX_HTHRESH    7
#define MAX_LTHRESH    7
#define MAX_HNOISE     15
#define MAX_LNOISE     15
#define MAX_MIN_HICNT  15
#define MAX_MIN_LOWCNT 7
#define MAX_DT_THR     127
#define MAX_NOISESUM   127
#define MAX_BLACK_THR  255
#define MAX_MIN_IMAGE  31
#define MAX_MAX_GRAY   15
```

Appendix B

```
/***********************************************************************
Copyright (c) 1989 Xerox Corporation. All Rights Reserved.
Copyright protection claimed include all forms and matters
of copyrightable material and information now allowed by
statutory or judicial law or hereafter granted, including.
without limitation, material generated from the software
programs which are displayed on the screen such as icons,
screen display looks, etc.
***********************************************************************/
typedef int (*PF)();

extern int NullProc();

typedef struct simobject {
        char *myname;       /* name of the object */
        char *date;         /* date of last revision of object */
        int  token;         /* token ID for the lex analyzer */
        PF startsim;        /* function called before anything */
        PF preparse;        /* function called before specification parsing */
        PF doparse;         /* function called during specification parsing */
        PF postparse;       /* function called after specification parsing */
        PF vector8;         /* function called to program 8-bit vectors */
        PF vector16;        /* function called to program 16-bit vectors */
        PF prepage;             /* function called before processing page */
        PF preline;         /* function called before processing each line */
        PF doline;          /* function called to processing each line */
        PF postline;     /* function called after processing each line */
        PF postpage;        /* function called after processing page */
        PF report;          /* function called to issue report */
        PF setvalue;        /* function called to set a value */
        PF getvalue;        /* function called to get a value */
        PF endsim;          /* function called after everything */
} SimObject;

extern SimObject *ObjectList[];

#define CallObjects(A) {int i; for(i = 0;ObjectList[i];i + +)ObjectList[i]->A();}
#define CallObjects2(A,B) {int i; for(i = 0;ObjectList[i];i + +)ObjectList[i]->A(B);}
define CallObjects3(A,B,C) {int i; for(i = 0;ObjectList[i];i + +)ObjectList[i]->A(B,C);} extern SimObject ProgramMode;
extern SimObject BkgDetect;
extern SimObject Segmentation;
extern SimObject SegmentEffect;
extern SimObject SegmentMask;
extern SimObject WindowSize;
extern SimObject WindowEffect;
extern SimObject Filter;
extern SimObject Vector1D90;
extern SimObject Vector1D90Out;
extern SimObject Vectorint91;
extern SimObject Vectorint91Out;
extern SimObject Vector2D90;
extern SimObject VectorSeg90;
```

Appendix B

```
extern SimObject TrcMapping;
extern SimObject DynamicRange;
extern SimObject ScaleFactor;
extern SimObject SlowScaleRun;
extern SimObject Suppression;
extern SimObject MoireAway;
extern SimObject StippleValue;
extern SimObject Threshold;
extern SimObject ScreenCell;
extern SimObject Inversion;
extern SimObject OutputPack;
```

Appendix B

```
/***********************************************************************
Copyright (c) 1989 Xerox Corporation. All Rights Reserved.
Copyright protection claimed include all forms and matters
of copyrightable material and information now allowed by
statutory or judicial law or hereafter granted, including
without limitation, material generated from the software
programs which are displayed on the screen such as icons,
screen display looks, etc.
***********************************************************************/
#define ERROR -1
define OK     0 typedef union _tokenval
{
    double dval;
    char *pval;
    int  ival;
} TOKENVAL;

#define TTYPE_D 1
#define TTYPE_P 2
define TTYPE_I 3 typedef struct _specs
{
    char *id;
    int ttype;
    TOKENVAL value;
} SPECS;
```

What is claimed is:

1. An image processing device for filtering digital image data, comprising:

a plurality of discrete one-dimensional first dimension filters operating concurrently on real-time digital image data in a first dimension, each of the first dimension filters operating on the digital image data in accordance with predetermined filter coefficients to produce a one-dimensional output signal, and wherein each of the plurality of first dimension filters includes means for latching the input digital image data in the first dimension, means for adding a plurality of symmetric pairs of the latched digital image data to produce a sum for each pair, means for latching the resultant sums of each of the symmetric pair data, means for multiplying the latched sums by predetermined filter coefficients, including means for sequentially selecting each resultant sum and a predetermined filter coefficient uniquely associated therewith to produce a plurality of products therefrom, and means for accumulating the products output by the multiplying means, to produce an output for the first dimension filter;

a single second dimension filter, operating in a second, distinct dimension, for receiving output signals from one of the plurality of first dimension filters and operating on the output signals in real-time in accordance with one of a plurality of sets of predetermined filter coefficients to produce a second filtered output signal therefrom;

means, operating in conjunction with the first and second dimension filters, for controlling the non-predetermined selection of the first dimension filter and the set of filter coefficients to be used as inputs to the second dimension filter; and a plurality of context buffers, each context buffer being suitable for storing the output signals from one of the first dimension filters and with the control means regulating the access of the second dimension filter to the context buffers.

2. The image processing device of claim 1, wherein the multiplying means operates at a rate greater than the incoming data rate, thereby enabling a single multiplication means to sequentially produce all of the multiplication products during a single input data cycle.

3. An image processing device for filtering digital image data, comprising:

a plurality of discrete one-dimensional first dimension filters operating concurrently on real-time digital image data in a first dimension, each of the first dimension filters operating on the digital image data in accordance with predetermined filter coefficients to produce a one-dimensional output signal; and a single second dimension filter, operating in a second, distinct dimension, for receiving output signals from one of the plurality of first dimension filters and operating on the output signals in real-time in accordance with one of a plurality of sets of predetermined filter coefficients to produce a second filtered output signal therefrom;

means, operating in conjunction with the first and second dimension filters, for controlling the non-predetermined selection of the first dimension filter and the set of filter coefficients to be used as inputs to the second dimension filter; and a plurality of context buffers, each context buffer being suitable for storing the output signals from one of the first dimension filters and with the control means regulating the access of the second dimension filter to the context buffers, wherein the second dimension filter includes means, operative on a pixel by pixel basis, for selecting the context buffer to be used for input to the second dimension filter, means for adding a plurality of symmetric first dimension output signals within the context buffer to produce a sum for each pair, means for latching the resultant sums of each of the symmetric first dimension output signals, means for multiplying the latched sums by predetermined filter coefficients including means for sequentially selecting each resultant sum and a predetermined filter coefficient uniquely associated therewith to produce a plurality of products therefrom, and means for accumulating the products output by the multiplication means, to produce an output for the second dimension filter.

4. The image processing device of claim 3, wherein said multiplying means operates at a rate greater than the incoming data rate, thereby enabling said multiplying means to sequentially produce all of the multiplication products during a single input data cycle.

5. The image processing device of claim 4 further comprising:

means for scaling the output of the second dimension filter in accordance with a predetermined scale factor; and means, suitable for the detection of overflow and underflow conditions, for correcting such conditions when present in the output of the second dimension filter.

6. A filter device providing a plurality of two dimensional digital filters, comprising:

a plurality of discrete one-dimensional first stage filters, each concurrently producing in real-time a one-dimensional filtered output signal from an array of input pixel signals wherein each of the plurality of first stage filters includes a context buffer for storing a set of predetermined filter coefficients, means for latching the input pixel signals, means for combining a plurality of symmetric pairs of the latched input pixel signals to produce a signal representative of the sum of the symmetric signals for each pair, means for latching the resultant sums of each of the symmetric pair signals, means for multiplying the latched sums by the predetermined filter coefficients including means for sequentially selecting each resultant sum and a predetermined filter coefficient uniquely associated therewith to produce a plurality of products therefrom, and means for accumulating the signals representing the products output by the multiplying means, to produce an accumulated output signal for the first stage filter;

a one-dimensional second stage filter, suitable for receiving a one-dimensional filtered output signal from a selected one of said first stage filters and applying a second filtering operation thereto in real-time, to produce a two-dimensional filtered output signal;

multiplexing means for controlling the non-predetermined selection of one of the output signals of the first stage filters to be used as the input to the second stage filter;

a plurality of context buffers suitable for storing the output signals from each of the first stage filters to enable the second stage filter to access the stored output signals in accordance with the selection determined by the multiplexing means; and means, operating in conjunction with the first and second stage filters and the multiplexing means, for controlling the multiplexer selection of the first stage filter output on a pixel signal basis.

7. The filter device of claim 6, wherein said multiplying means operates at a speed greater than the incoming signal frequency, thereby enabling said multiplying means to sequentially produce all of the multiplication products during a single input signal cycle.

8. A filter device providing a plurality of two dimensional digital filters, comprising:

a plurality of discrete one-dimensional first stage filters, each concurrently producing in real-time a one-dimensional filtered output signal from an array of input pixel signals;

a one-dimensional second stage filter, suitable for receiving a one-dimensional filtered output signal from a selected one of said first stage filters and applying a second filtering operation thereto in real-time, to produce a two-dimensional filtered output signal, multiplexing means for controlling the non-predetermined selection of one of the output signals of the first stage filters to be used as the input to the second stage filter;

a plurality of context buffers suitable for storing the output signals from each of the first stage filters to enable the second stage filter to access the stored output signals in accordance with the selection determined by the multiplexing means; and means, operating in conjunction with the first and second stage filters and the multiplexing means, for controlling the multiplexer selection of the first stage filter output on a pixel signal basis;

wherein the second stage filter includes, a context buffer for storing a set of predetermined filter coefficients, means, operative on a pixel signal by pixel signal basis, for selecting the context buffer to be used for input to the second stage filter, means for combining a plurality of pairs of symmetric signals stored within the context buffer to produce signals representative of each of the sums of the symmetric signal pairs, means for latching the resultant sums of each of the symmetric signal pairs, means for multiplying the latched sums by the predetermined filter coefficients including means for sequentially selecting each latched sum and a predetermined filter coefficient uniquely associated therewith to produce a plurality of products therefrom, and means for accumulating the signals representing the products output by the multiplying means, to produce an accumulated output for the second stage filter.

9. The filter device of claim 8, wherein said multiplying means operates at a speed greater than the incoming signal frequency, thereby enabling said multiplying means to sequentially produce all of the multiplication products during a single input signal cycle.

10. The filter device of claim 9 further comprising:

means for scaling the output of the second stage filter in accordance with a predetermined scale factor; and means for detecting overflow and underflow conditions in the output signal of the second stage filter and for correcting such conditions when detected.

11. An apparatus for implementing a plurality of two-dimensional finite impulse response filters for the processing of a digital image represented as an x-y array of digital data elements, comprising:

memory means for storing up to n sets of filter coefficients to be applied to the digital data;

a plurality of discrete one-dimensional first dimension filters operating concurrently on the digital image data along the y direction, each filter producing in real-time a single output value for each set of digital input values in accordance with one of said sets of filter coefficients wherein each of the plurality of first dimension filters includes, means for latching the input digital image data, means for adding a plurality of symmetric pairs of the latched digital image data values to produce sums thereof for each pair, means for latching the resultant sums of each of the symmetric pair values, means for multiplying the latched sums by predetermined filter coefficients including means for sequentially selecting each resultant sum and a predetermined filter coefficient uniquely associated therewith to produce a plurality of products therefrom, and means for accumulating the products output by the multiplying means, to produce an output for the first dimension filters;

means for storing a plurality of sets of output context, each context set consisting of a plurality of sequential output values generated by one of the first dimension filters;

means, operating in conjunction with the first dimension filters, for selecting in a non-predetermined manner a stored context set and an associated filter coefficient set; and a subsequent one-dimensional second dimension filter operating upon the stored context set to produce a filtered output pixel value in real-time in accordance with the selected set of filter coefficients.

12. The apparatus of claim 11, wherein said multiplying means operates at a rate greater than the incoming data rate, thereby enabling said multiplying means to sequentially produce all of the multiplication products during a single digital data element input cycle.

13. An apparatus for implementing a plurality of two-dimensional finite impulse response filters for the processing of a digital image represented as an x-y array of digital data elements, comprising:

memory means for storing up to n sets of filter coefficients to be applied to the digital data;

a plurality of discrete one-dimensional first dimension filters operating concurrently on the digital image data along the y direction, each filter producing in real-time a single output value for each set of digital input values in accordance with one of said sets of filter coefficients;

means for storing a plurality of sets of output context, each context set consisting of a plurality of sequential output values generated by one of the first dimension filters;

means, operating in conjunction with the first dimension filters, for selecting in a non-predetermined manner a stored context set and an associated filter coefficient set; and a subsequent one-dimensional second dimension filter operating upon the stored context set to produce a filtered output pixel value in real-time in accordance with the selected set of filter coefficients, wherein the subsequent second dimension filter includes, means, operative on an element by element basis, for selecting the context storage means to be used for data input to the subsequent one-dimensional filter, means for adding a plurality of pairs of symmetric element values within the context storage means to produce sums thereof for each pair, means for latching the resultant sums of each of the pairs of symmetric values, means for multiplying the latched sums by predetermined filter coefficients including means for sequentially selecting each resultant sum and a predetermined filter coefficient uniquely associated therewith to produce a plurality of products therefrom, and means for accumulating the products output by the multiplication means, to produce an output for the subsequent one-dimensional filter.

14. The apparatus of claim 13, wherein said multiplying means operates at a rate greater than the incoming data rate, thereby enabling said multiplying means to sequentially produce all of the multiplication products during a single data input cycle.

15. The apparatus of claim 14 further comprising:

means for scaling the output of the subsequent second dimension filter in accordance with a predetermined scale factor; and means for detecting overflow and underflow conditions and for correcting such conditions when present in the output of the second dimension filter.

16. An apparatus for implementing a plurality of m by n two-dimensional finite impulse response filters for the processing of a digital image represented as an orthogonal array of digital image signals, comprising:

memory means for storing a plurality of unique sets of filter coefficients to be applied to the digital signals;

a plurality of one-dimensional first dimension filters operating on m digital input signals, each of the filters producing in real-time a single output signal for each set of digital input signals in accordance with one of the plurality of unique sets of filter coefficients wherein each of the plurality of first dimension filters includes, means for latching the m digital input signals, means for adding a plurality of symmetric pairs of the latched signals to produce sums thereof for each pair, means for latching the resultant sums of each of the symmetric pairs of the latched signals means for multiplying the latched sums by the selected coefficients from the plurality of unique sets of filter coefficients including means for sequentially selecting each resultant sum and a predetermined filter coefficient uniquely associated therewith to produce a plurality of products therefrom, and means for accumulating the products output by the multiplying means, to produce an output for the first dimension filters a plurality of n element wide context buffers for sequentially storing the output signals generated by the first dimension filters, each of the buffers being capable of storing n sequentially generated output values from each of the first dimension filters;

means for selecting in a non-predetermined manner one of the plurality of first dimension filter context buffers;

means, operating in conjunction with the plurality of first dimension filter context buffers, for reading the stored output signals from the selected context buffer;

means, operating in conjunction with said context buffer selecting means, for selecting one of the plurality of unique sets of filter coefficients associated with the selected context buffer; and a single n element, one-dimensional second dimension filter operating on the stored output signals from the selected context buffer to produce in real-time a filtered output signal in accordance with the selected set of filter coefficients.

17. The apparatus of claim 16, wherein said multiplying means operates at a rate greater than the incoming digital input signal rate, thereby enabling said multiplying means to sequentially produce all of the multiplication products during a single digital signal input cycle.

18. An apparatus for implementing a plurality of m by n two-dimensional finite impulse response filters for the processing of a digital image represented as an orthogonal array of digital image signals, comprising:

memory means for storing a plurality of unique sets of filter coefficients to be applied to the digital signals;

a plurality of one-dimensional first dimension filters operating on m digital input signals, each of the filters producing in real-time a single output signal for each set of digital input signals in accordance with one of the plurality of unique sets of filter coefficients;

a plurality of n element wide context buffers for sequentially storing the output signals generated by the first dimension filters, each of the buffers being capable of storing n sequentially generated output values from each of the first dimension filters;

means for selecting in a non-predetermined manner one of the plurality of first dimension filter context buffers;

means, operating in conjunction with the plurality of first dimension filter context buffers, for reading the stored output signals from the selected context buffer;

means, operating in conjunction with said context buffer selecting means, for selecting one of the plurality of unique sets of filter coefficients associated with the selected context buffer; and a single n element, one-dimensional second dimension filter operating on the stored output signals from the selected context buffer to produce in real-time a filtered output signal in accordance with the selected set of filter coefficients, wherein the n element second dimension filter includes means, operative on a signal by signal basis, for selecting the context buffer to be used for data input to the n element filter, means for adding a plurality of pairs of symmetric element values within the context buffer to produce sums thereof for each pair, means for latching the resultant sums of each pair of the symmetric values, means for multiplying the latched sums by the selected coefficients from the plurality of unique sets of filter coefficients including means for sequentially selecting each resultant sum and a predetermined filter coefficient uniquely associated therewith to produce a plurality of products therefrom, and means for accumulating the products output by the multiplication means, to produce an output for the n element second dimension filter.

19. The apparatus of claim 18, wherein said multiplying means operates at a rate greater than the incoming digital signal rate, thereby enabling said multiplying means to sequentially produce all of the multiplication products during a single signal input cycle.

20. The apparatus of claim 19 further comprising:

means for scaling the output of the n element second dimension filter in accordance with a predetermined scale factor;

means for the detection of overflow and underflow conditions; and means for correcting such conditions when present in the output out of the second dimension filter.

21. A method for implementing a plurality of two-dimensional digital filters, comprising the steps of:

simultaneously applying, in real-time, a plurality of one-dimensional first dimension filters to digital signals representing pixels oriented along a first direction, each first dimension filter concurrently operating on the digital signals in accordance with a unique set of first dimension filter coefficients;

subsequently storing the output signals from each of the first dimension filters, wherein the output signals generated by each first dimension filter are stored in a unique buffer associated therewith;

selecting, in a non-predetermined manner in accordance with the desired filter characteristics, a buffer to be used as an input buffer for a subsequent filtering operation; and applying, in real-time, a one-dimensional second dimension filter to the signals stored in the selected input buffer, the second dimension filter operating on the stored signals in accordance with a set of second dimension filter coefficients to produce a two-dimensional filtered output, further including the steps of scaling the output of the second dimension filter in accordance with a predetermined scale factor, wherein the predetermined scale factor is a function of the absolute value of the first dimension and the second dimension filter coefficients, detecting overflow and underflow conditions in the output of the second dimension filter, and correcting for the overflow and underflow conditions, when detected.

* * * * *